US010775430B2

(12) United States Patent
Pillay et al.

(10) Patent No.: US 10,775,430 B2
(45) Date of Patent: Sep. 15, 2020

(54) FAULT CAMPAIGN IN MIXED SIGNAL ENVIRONMENT

(71) Applicant: Mentor Graphics Corporation, Wilsonville, OR (US)

(72) Inventors: Sanjay Pillay, Austin, TX (US); Arun Kumar Gogineni, Cedar Park, TX (US); Srikanth Rengarajan, Austin, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/224,434

(22) Filed: Dec. 18, 2018

(65) Prior Publication Data

US 2019/0187207 A1    Jun. 20, 2019

Related U.S. Application Data

(60) Provisional application No. 62/607,312, filed on Dec. 18, 2017.

(51) Int. Cl.
| | |
|---|---|
| *G06F 17/50* | (2006.01) |
| *G01R 31/317* | (2006.01) |
| *G06F 30/33* | (2020.01) |

(52) U.S. Cl.
CPC ....... *G01R 31/31704* (2013.01); *G06F 30/33* (2020.01)

(58) Field of Classification Search
CPC .. G01R 31/31704; G06F 30/33; G06F 30/367

USPC .......................................... 716/106, 111, 136
See application file for complete search history.

(56) References Cited

U.S. PATENT DOCUMENTS

| 8,296,699 | B1 * | 10/2012 | Chetput | .................. G06F 30/33 |
| | | | | 716/106 |
| 9,581,644 | B2 * | 2/2017 | Li | ........................ G01R 31/3177 |
| 2010/0229061 | A1 * | 9/2010 | Hapke | ............ G01R 31/318342 |
| | | | | 714/740 |

\* cited by examiner

*Primary Examiner* — Nghia M Doan
(74) *Attorney, Agent, or Firm* — Mentor Graphics Corporation

(57) ABSTRACT

A computing system implementing a functional safety validation tool to simulate a circuit design having a digital portion and an analog portion, and inject a fault into the digital portion of a simulated circuit design, which propagates towards alarm logic configured to detect the injected fault. When the injected fault propagates to a boundary between the digital portion and the analog portion, the functional safety validation tool can perform a parallel simulation of the analog portion, which propagates the injected fault from the boundary through the analog portion to an output. The functional safety validation tool can determine whether the analog portion of the circuit design suppresses the injected fault based on a value at the output. The functional safety validation tool can generate a fault coverage presentation identifying a diagnostic coverage of the alarm logic based on whether the injected fault was suppressed.

20 Claims, 5 Drawing Sheets ns typically perform functional safety validation, such as FMEA or FMEDA, by utilizing gate level timing simulations on a digital portion of the logical designs to identify critical faults in the digital portion of the logical design. When, however, the logical design includes an analog portion, the functional safety tools treat the analog portion as a black-box and cease performing functional safety validation when, for example, a fault is injected during a fault campaign that propagates into the analog portion of the logical design.

FAULT CAMPAIGN IN MIXED SIGNAL ENVIRONMENT

RELATED APPLICATION

This patent application claims priority to U.S. Provisional Patent Application No. 62/607,312, filed Dec. 18, 2017, which is incorporated by reference herein.

TECHNICAL FIELD

This application is generally related to electronic design automation and, more specifically, to implementing fault campaign to analyze failures rates in mixed-signal circuit designs.

BACKGROUND

Designing and fabricating electronic systems typically involves many steps, known as a "design flow." The particular steps of a design flow often are dependent upon the type of electronic system to be manufactured, its complexity, the design team, and the fabricator or foundry that will manufacture the electronic system from a design. Typically, software and hardware "tools" verify the design at various stages of the design flow by running simulators and/or hardware emulators, or by utilizing formal techniques, allowing any errors in the design discovered during the verification process to be corrected.

Initially, a specification for a new electronic system can be transformed into a logical design, sometimes referred to as a register transfer level (RTL) description of the electronic system. With this logical design, the electronic system can be described in terms of both the exchange of signals between hardware registers and the logical operations that can be performed on those signals. The logical design typically employs a Hardware Design Language (HDL), such as System Verilog or Very high speed integrated circuit Hardware Design Language (VHDL).

The logic of the electronic system can be analyzed to confirm that it will accurately perform the functions desired for the electronic system, sometimes referred to as "functional verification." Design verification tools can perform functional verification operations, such as simulating, emulating, and/or formally verifying the logical design. For example, when a design verification tool simulates the logical design, the design verification tool can provide transactions or sets of test vectors, for example, generated by a simulated test bench, to the simulated logical design. The design verification tools can determine how the simulated logical design responded to the transactions or test vectors, and verify, from that response, that the logical design describes circuitry to accurately perform functions.

After functional verification, the logical design can be examined for potential failures in products or processes, sometimes referred to as "functional safety validation." Functional safety tools can perform functional safety validation by examining the logical design for potential failures and helping select remedial actions that reduce cumulative impacts of life-cycle consequences or risks from a systems failure or fault. Some types of functional safety validation can include Failure Mode and Effects Analysis (FMEA) or Failure Modes, Effects, and Diagnostic Analysis (FMEDA), which can be used in conjunction with design and manufacturing processes, and has found many applications in the automotive, aerospace, biomedical and other safety critical or security related industries. The functional safety tools

SUMMARY

This application discloses a computing system implementing a functional safety validation tool to simulate a circuit design having a digital portion and an analog portion. The functional safety validation tool can simulate the digital portion of the circuit design with a digital simulator, and simulate the analog portion of the circuit design with an analog simulator. The functional safety validation tool can inject a fault into the digital portion of the simulated circuit design, which allows the digital simulator to propagate towards alarm logic configured to detect the injected fault. When the injected fault propagates to a boundary between the digital portion of the simulated circuit design and an analog portion of the simulated circuit design, the functional safety validation tool can direct the analog simulator to perform a parallel simulation of the analog portion, which propagates the injected fault from the boundary through the analog portion of the circuit design to an output. The parallel simulation can be a second simulation of at least a section of the analog portion of the circuit design.

The functional safety validation tool can determine whether the analog portion of the circuit design, during the parallel simulation, suppresses the injected fault propagated through the analog portion from detection by the alarm logic based on a value at the output from the analog portion generated during the parallel simulation. When the functional safety validation tool determines that the injected fault was suppressed, the functional safety validation tool can stop the parallel simulation and record a diagnostic coverage event corresponding to the alarm logic when the analog portion of the circuit design was determined to suppressed the injected fault. When the functional safety validation tool determines that the injected fault was not suppressed, the functional safety validation tool can propagate the value at the output of the analog portion generated during the parallel simulation towards the alarm logic through the digital portion of the simulated circuit design. The functional safety validation tool can determine the propagation of the value at the output of the analog portion triggered the alarm logic, and record a diagnostic coverage event corresponding to the triggering of the alarm logic. The functional safety validation tool can generate a fault coverage presentation identifying a diagnostic coverage of the alarm logic that includes the record diagnostic coverage event. Embodiments will be described in greater detail below.

DETAILED DESCRIPTION

Illustrative Operating Environment

Figure 1:
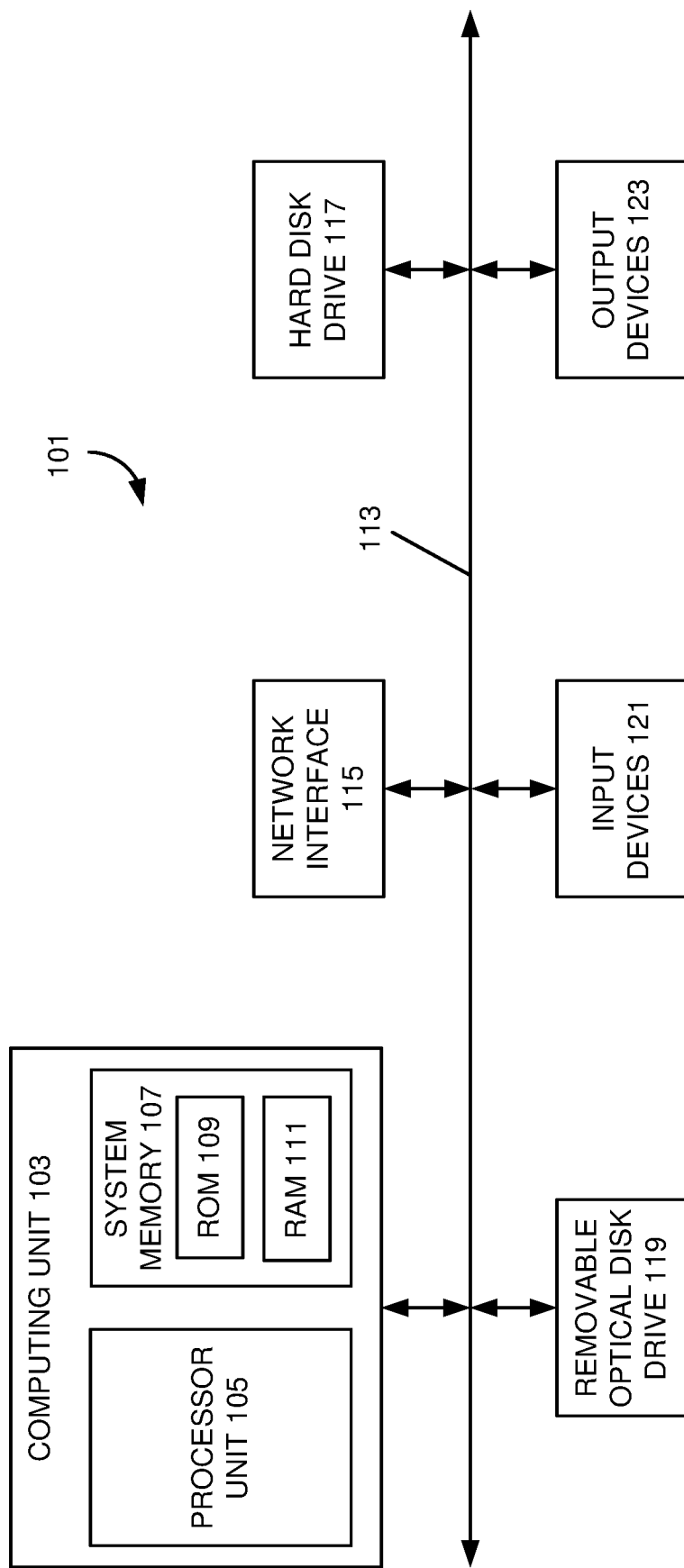
FIGS. 1 and 2 illustrate an example of a computer system of the type that may be used to implement various embodiments.

Various embodiments may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
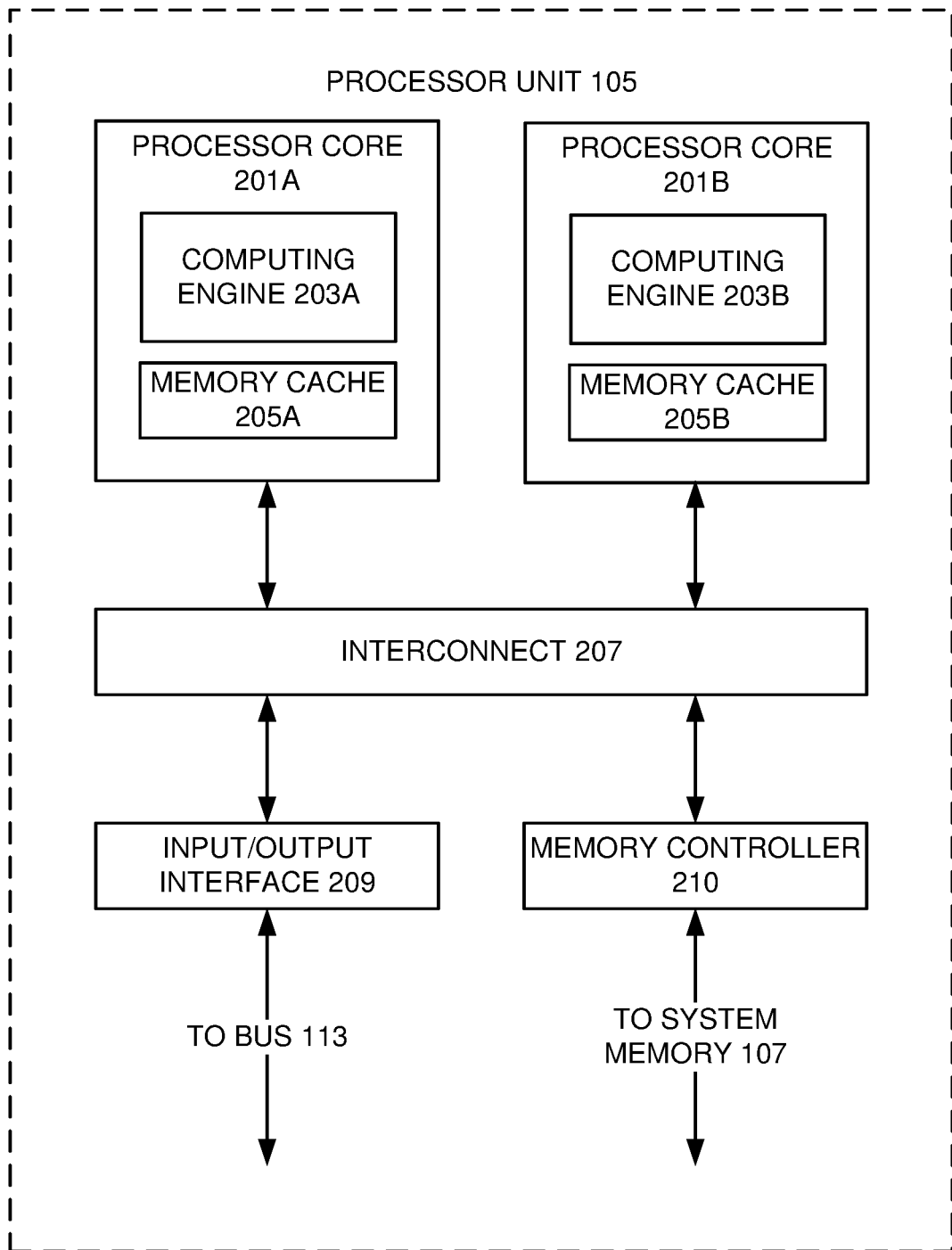

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Example Verification Environment

Figure 3:
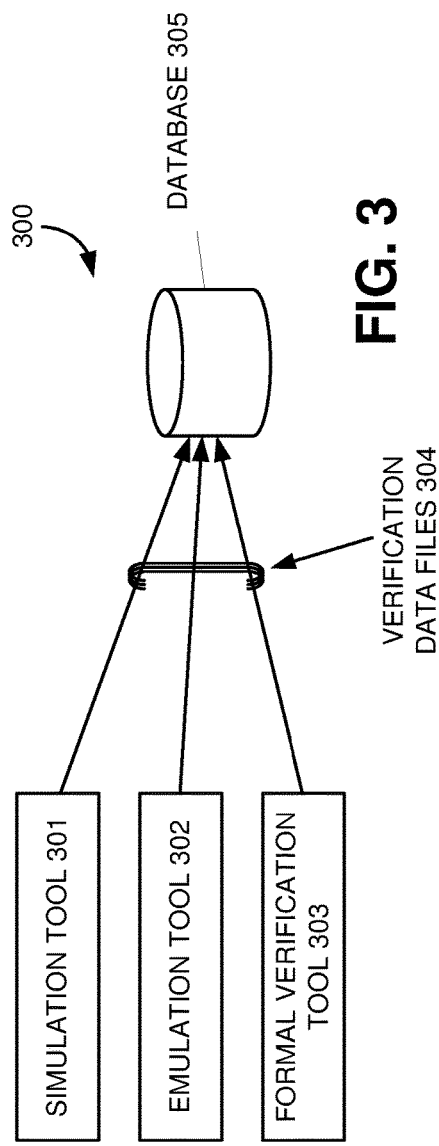
FIG. 3 illustrate an example verification system generated verification data from multiple verification tools that may be implemented according to various embodiments.

FIG. 3 illustrate an example verification system 300 storing coverage data from multiple verification tools that may be implemented according to various embodiments. Referring to FIG. 3, the verification data system 300 can include multiple verification tools, such as a simulation tool 301, an emulation tool 302, a formal verification tool 303, or the like, to functionally verify an electronic design described by a circuit design and generate verification data files 304 for storage in a database 305. In some embodiments, the verification data files 304 can include a Value Change Dump (VCD) file, for example, in an ASCII-based format. The circuit design can describe the electronic device both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with code in a hardware description language (HDL), such as Very high speed integrated circuit Hardware Design Language (VHDL), System C, or the like. In some embodiments, the verification tools can receive the circuit design from a source external to the verification tools, such as a user interface of the computer network 101, another tool implemented by the computer network 101, or one or more of the verification tools may generate the circuit design internally.

The simulation tool 301 and the emulation tool 302 can respectively simulate or emulate a test bench and a design under verification, such as the circuit design, and generate the verification data files 304. The emulation tool 302 can perform functional verification with one or more hardware emulators configured to emulate the design under verification. The simulation tool 301 can implement the design verification tool with one or more processors configured to simulate the design under verification.

The test bench, during simulation or emulation, can generate test stimulus, for example, clock signals, activation signals, power signals, control signals, and data signals that, when grouped, may form test bench transactions capable of prompting operation of the design under verification. In some embodiments, the test bench can be written in an object-oriented programming language, for example, SystemVerilog or the like, which, when executed during elaboration, can dynamically generate test bench components for verification of the circuit design. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench. The simulated or emulated design under verification, in response to the test stimuli, can generate output, which can be compared to expected output of the design under verification in response to the test stimuli by the simulation tool 301 or the emulation tool 302.

The formal verification tool 303 can analyze the circuit design in an attempt to functionally verify portions of the circuit design. In some embodiments, the formal verification tool 303 can utilize one or more formal techniques, such as a Binary Decision Diagram (BDD), a Boolean Satisfiability (SAT) Solver, an Automatic Test Pattern Generator (ATPG), Cut Point Prover, or the like, in an attempt to prove or disprove functionality of circuit design. The formal verification tool 303 also can utilize static design checking functionality, such as a clock domain crossing check, a reset domain check, a power domain check, or the like, which can be utilized in an attempt to functionally verify portions of the circuit design.

Functional Safety Validation in a Mixed Signal Environment

Figure 4:
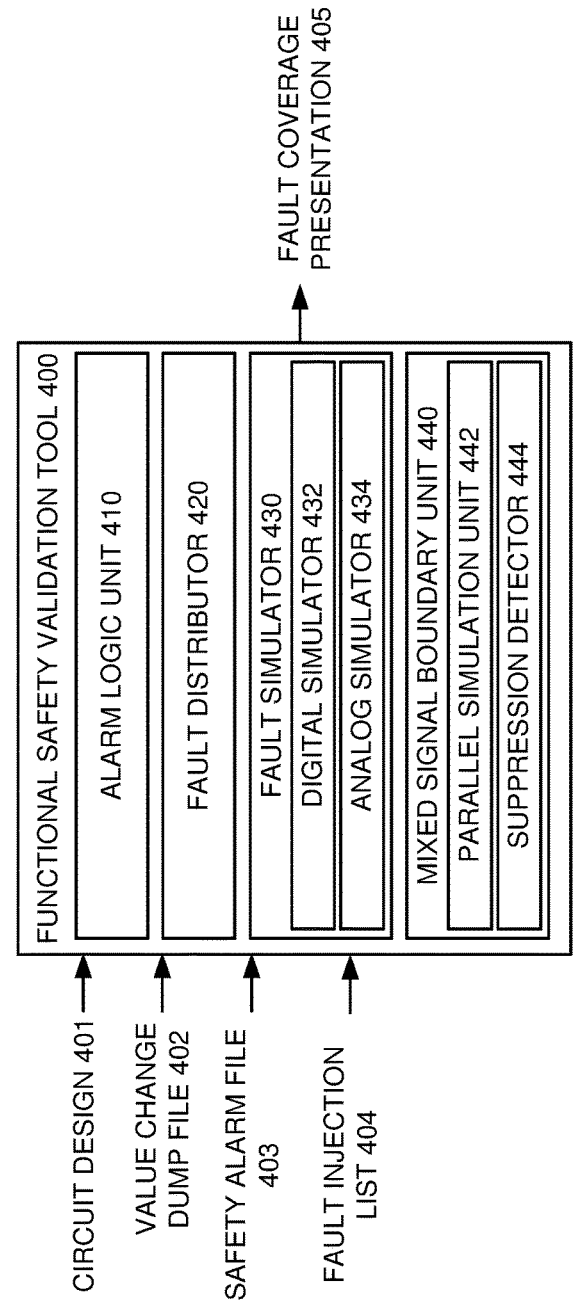
FIG. 4 illustrates an example functional safety validation tool with injected fault detection in a mixed-signal environment, which may be implemented according to various embodiments.
Figure 5:
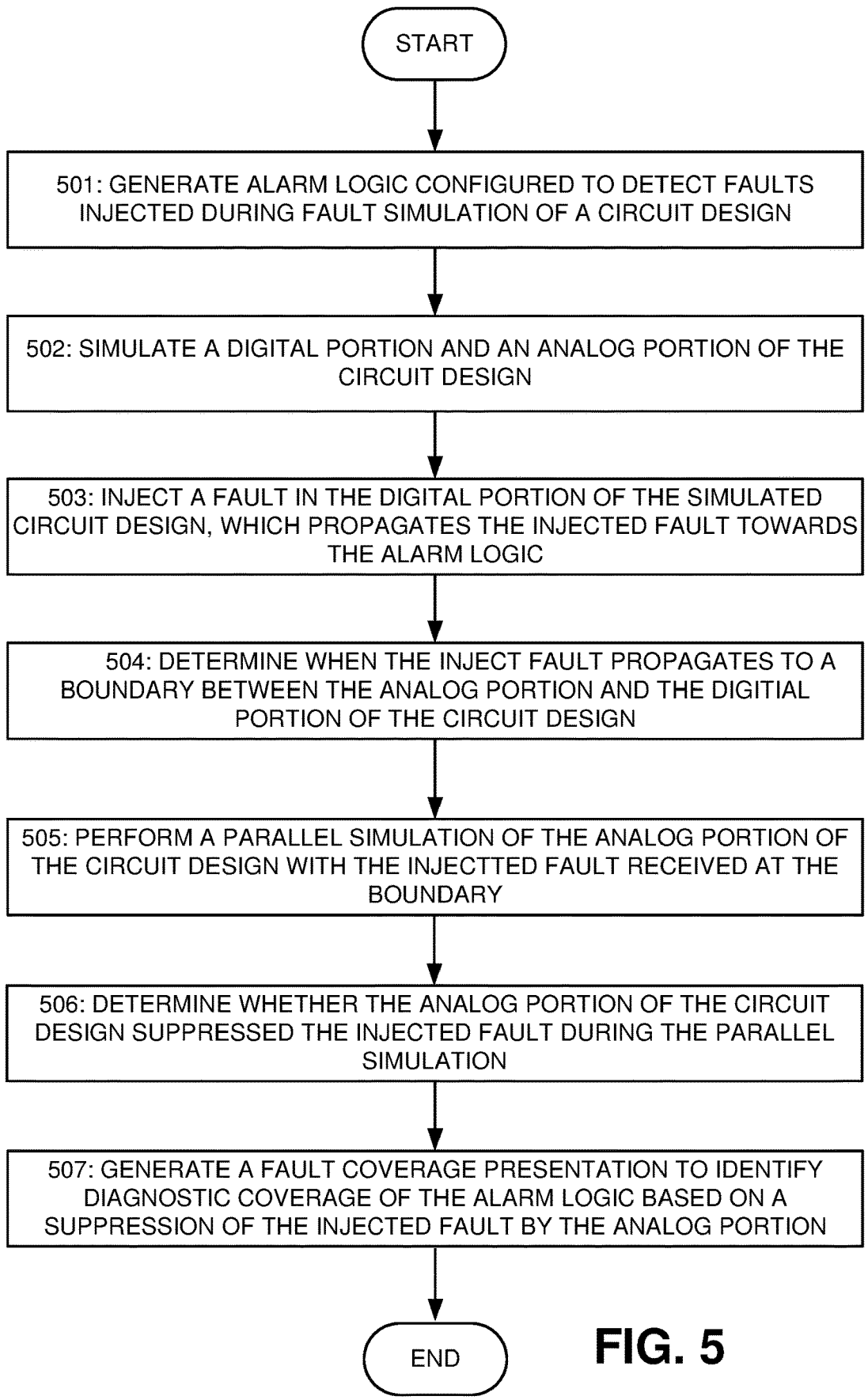
FIG. 5 illustrates an example flowchart implementing injected fault detection in a mixed-signal environment, which may be implemented according to various embodiments.

FIG. 4 illustrates an example functional safety validation tool 400 with injected fault detection in a mixed-signal environment, which may be implemented according to various embodiments. FIG. 5 illustrates an example flowchart implementing injected fault detection in a mixed-signal environment, which may be implemented according to various embodiments. Referring to FIGS. 4 and 5, the functional safety validation tool 400 can receive a circuit design 401 that describes an electronic device having digital circuitry and analog circuitry. The digital portion of the circuit design 401 can be described both in terms of an exchange of data signals between components in the electronic device, such as hardware registers, flip-flops, combinational logic, or the like, and in terms of logical operations that can be performed on the data signals in the electronic device. The digital portion of the circuit design 401 can be gate-level netlist for the electronic device or model the electronic device at a register transfer level (RTL), for example, with code in a hardware description language (HDL), such as Very high speed integrated circuit Hardware Design Language (VHDL), System C, Verilog, or the like.

The analog portion of the circuit design 401 can include modules that encapsulate high-level behavioral descriptions as well as structural descriptions of the analog circuitry in the electronic device. In some embodiments, the analog portion of the circuit design 401 can be modeled in a MATLAB environment, in a hardware description language (HDL), such as Verilog-AMS, Verilog-A, SPICE, or the like.

The functional safety validation tool 400 can receive a value change dump (VCD) file 402, for example, generated during functional verification of digital portion of the circuit design 401 by design verification tools. In some embodiments, the value change dump (VCD) file 402 can describe time-ordered value changes for signals that occurred during functional verification of the circuit design 401, which can be specified in an ASCII-based format.

The functional safety validation tool 400 can receive a safety alarm file 403 to describe functionality capable of detecting faults occurring during a fault injection campaign. The functional safety validation tool 400 can receive a fault injection list 404 that includes possible faults to inject into the circuit design during a fault injection campaign and portions of the circuit design 401 to inject the possible faults.

The functional safety validation tool 400 can utilize the circuit design 401, the value change dump (VCD) file 402, the safety alarm file 403, and the fault injection list 404 to inject faults during fault simulation of the circuit design 401 and generate a fault coverage report 405 based, at least in part, on whether the functional safety validation tool 400 detected the injected faults.

The functional safety validation tool 400 can include an alarm logic unit 410, which in a block 501 of FIG. 5, can generate alarm logic configured to detect faults injected during fault simulation of the circuit design 401. In some embodiments, the alarm logic, when implemented in the digital portion of the circuit design 401 during simulation, can compare values propagated during a fault injection campaign against expected values to detect a presence of the injected faults. The alarm logic can be triggered during fault simulation due to a detection of an injected fault and can inform the functional safety validation tool 400 of the presence of an injected fault in response to being triggered.

The functional safety validation tool 400 can include a fault simulator 430, which in a block 502 of FIG. 5, can simulate the analog portion and the digital portion the circuit design 401. The functional safety validation tool 400 can include a fault distributor 420 to insert the alarm logic generated by the alarm logic unit 410 into the digital portion of the circuit design 401 being simulated by the fault simulator 430. The fault distributor 420 can identify a stimulus vector for the simulated circuit design 401 and direct a digital simulator 432 in the fault simulator 430 to set nodes of the digital portion of the circuit design 401 to values associated with the stimulus vector. The digital simulator 432 can propagate the values set according to the stimulus vector through logic cones of the digital portion of the circuit design 401, for example, gate-level combinational logic and registers, to the alarm logic inserted into the gate-level simulation. The fault distributor 420 also can direct an analog simulator 434 in the fault simulator 430 to perform an analog simulation of the analog portion of the circuit design 401 based on the stimulus vector and/or the propagated values in the digital portion of the circuit design 401 set by the digital simulator 432 according to the stimulus vector.

In a block 503 of FIG. 5, the fault simulator 430, for example, based on direction from the fault distributor 420, can inject one or more of the faults from the fault injection list 404 into the digital portion of circuit design 401 and propagate the injected faults from the point of injection through the logic cones towards the alarm logic inserted into the gate-level simulation environment. The fault simulator 430 can determine when the alarm logic was triggered by the propagation of the injected faults during the gate-level simulation of the circuit design 401.

The functional safety validation tool 400 includes a mixed signal boundary unit 440 to identify one or more boundaries between the digital portion of the circuit design 401 and the analog portion of the circuit design 401. In some embodiments, the mixed signal boundary unit 440 can identify the boundaries based on signals or values input and output from the digital portion and the analog portion of the circuit design 401. For example, when the mixed signal boundary unit 440 identifies an input to the analog portion of the circuit design 401 comes from an output of the digital portion of the circuit design 401, the mixed signal boundary unit 440 can identify the input and output points as corresponding to a boundary between the digital portion of the circuit design 401 and the analog portion of the circuit design 401. Conversely, when the mixed signal boundary unit 440 identifies a signal input to the digital portion of the circuit design 401 comes from an output of the analog portion of the circuit design 401, the mixed signal boundary unit 440 can identify the input and output points as corresponding to a boundary between the digital portion of the circuit design 401 and the analog portion of the circuit design 401.

The mixed signal boundary unit 440 includes a parallel simulation unit 442, which in a block 504 of FIG. 5, can determine when the digital simulator 432 propagates an injected fault in the digital portion of the circuit design 401 to a boundary with the analog portion of the circuit design 401. The mixed signal boundary unit 440 can perform a digital-to-analog conversion on the value of the injected fault from the digital portion of the circuit design 401 received at the boundary with the analog portion of the circuit design 401.

The parallel simulation unit 442, in a block 505 of FIG. 5, can direct the analog simulator 434 to initiate another simulation of at least a section of the analog portion of the circuit design 401, for example, a section of the analog portion of the circuit design 401 capable of propagating a converted signal corresponding to the injected fault received at the boundary. This other simulation of the section of the analog portion of the circuit design 401 can be performed in parallel with the initial simulation of the analog portion of the circuit design 401. In some examples, the initial simulation of the analog portion of the circuit design 401 can allow the fault simulator 430, prior to the fault injection, to propagate values corresponding to the stimulus vector through the digital portion and analog portion of the circuit design 401. When the parallel simulation unit 442 determines the injected fault reaches the boundary with the analog portion of the circuit design 401, however, the parallel simulation unit 442 can initiate the parallel simulation of the section of the analog portion of the circuit design 401 to propagate the injected fault through that section of the analog portion of the circuit design 401.

The mixed signal boundary unit 440 can perform an analog-to-digital conversion on any value output from the analog portion of the circuit design 401 at a boundary with the digital portion of the circuit design 401. In some embodiments, the mixed signal boundary unit 440 can quantize the analog value received at the boundary and truncate the quantized value, for example, to a preset length.

The mixed signal boundary unit 440 includes a suppression detector 444, which in a block 506 of FIG. 5, can determine whether the analog portion of the circuit design, during the parallel simulation, suppresses the injected fault propagated through the analog portion from detection by the alarm logic based on a value at the output from the analog portion generated during the parallel simulation. In some embodiments, the suppression detector 444 can compare the value output from the analog portion of the circuit design 401—after conversion into a digital value—against the VCD file 402.

When the suppression detector 444 determines that the injected fault was suppressed, for example, the value in the VCD file 402 is the same as the converted output from the analog portion of the circuit 401, the suppression detector 444 can prompt the analog simulator 434 to stop the parallel simulation and record a diagnostic coverage event corresponding to the alarm logic when the analog portion of the circuit design was determined to suppressed the injected fault. When the suppression detector 444 determines that the injected fault was not suppressed, for example, the value in the VCD file 402 is not the same as the converted output from the analog portion of the circuit 401, the suppression detector 444 can allow the digital simulator 432 to propagate the value at the output of the analog portion generated during the parallel simulation towards the alarm logic through the digital portion of the circuit design 401.

The fault simulator 430 can determine when the propagation of the value at the output of the analog portion triggered the alarm logic. The functional safety validation tool 400 can record a diagnostic coverage event when the alarm logic was triggered by the propagation of the injected fault to the digital portion of the circuit design 401. In a block 507 of FIG. 5, the functional safety validation tool 400 can generate the fault coverage report 405 based, at least in part, on whether the functional safety validation tool 400 detected the injected faults. The fault coverage presentation 405 identifying a diagnostic coverage of the alarm logic can include the recorded diagnostic coverage event. In some embodiments, each diagnostic coverage event can identify the node injected with the fault, a fault value associated with the injected fault, and a stimulus vector utilized during the simulation of the circuit design 401 when the alarm logic was triggered.

Figure 6:
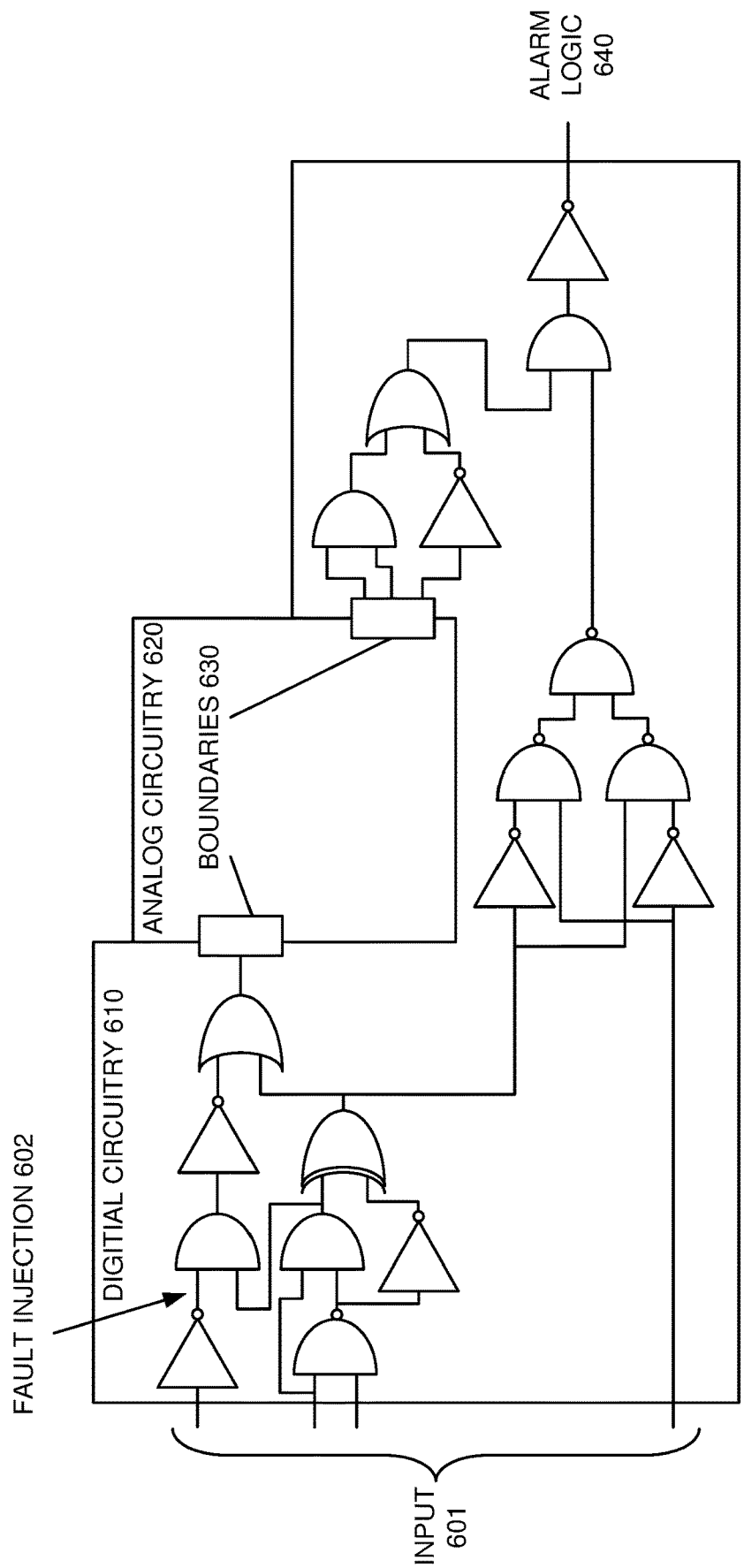
FIG. 6 illustrates example injected fault detection in a mixed-signal environment, which may be implemented according to various embodiments.

FIG. 6 illustrates example injected fault detection in a mixed-signal environment, which may be implemented according to various embodiments. Referring to FIG. 6, an electronic system described by a circuit design can include digital circuitry 610 and analog circuitry. The digital circuitry 610 can exchange signals or values with the analog circuitry 620 at boundaries 630. A digital simulator can simulate a digital portion of the circuit design and provide a stimulus vector at inputs 601 of the digital circuitry 610, which propagates values associated with the stimulus vector through the digital circuitry 610. An analog simulator can simulate an analog portion of the circuit design and propagate values between the boundaries 630 of the digital circuitry 610.

During a fault campaign, a fault simulator can inject a fault into a node of the digital circuitry 610, for example, fault injection 602, and the digital simulator can propagate the fault through the digital circuitry 610. The fault simulator can detect when the injected fault propagates in the digital circuitry 610 to one of the boundaries 630, and the analog simulator can initiate a parallel simulation of the analog circuitry 620, which can propagate the received injected fault between the boundaries 630.

The fault simulator can compare an output value from the analog circuitry 620 from at least one of the boundaries 630 against a VCD file from a functional verification of the circuit design. When the fault simulator determines the value in the VCD file is not the same as the output from the analog circuitry, the fault simulator can continue the parallel simulation of the analog circuitry 620 and the digital simulator to propagate the value output from the analog circuitry 620 corresponding to the injected fault toward alarm logic 640 simulated by the digital simulator. In some embodiments, the alarm logic 640 can detect the injected fault, which propagated through the circuit design, and the fault simulator can record a diagnostic coverage event corresponding to the alarm logic 640 when the alarm logic 640 was triggered by the propagation of the injected fault. When the fault simulator determines the analog circuitry 620 suppressed the injected fault, for example, when the value in the VCD file is the same as the output from the analog circuitry 620, the analog simulator can stop the parallel simulation of the analog circuitry 620 and record a diagnostic coverage event associated with the suppression of the injected fault.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments, those skilled in the art will appreciate that there are numerous variations and permutations of the above described systems and techniques that fall within the spirit and scope of the invention as set forth in the appended claims. For example, while some of the specific terminology has been employed above to refer to electronic design automation processes, it should be appreciated that various examples may be implemented using any electronic system.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:
1. A method comprising:
   simulating, by a computing system, a circuit design having a digital portion and an analog portion;

injecting, by the computing system, a fault into the digital portion of the simulated circuit design, which propagates towards alarm logic configured to detect the injected fault;

when the injected fault propagates to a boundary between the digital portion of the simulated circuit design and the analog portion of the simulated circuit design, performing, by the computing system, a parallel simulation of the analog portion relative to the simulation of the analog portion of the circuit design, which propagates the injected fault from the boundary through the analog portion of the circuit design to an output;

determining, by the computing system, whether the analog portion of the circuit design suppresses the injected fault propagated through the analog portion from detection by the alarm logic based on a value at the output from the analog portion generated during the parallel simulation; and generating, by the computing system, a fault coverage presentation identifying a diagnostic coverage of the alarm logic based, at least in part, on the determination of whether the analog portion of the circuit design suppressed the injected fault during the parallel simulation.

2. The method of claim 1, further comprising stopping, by the computing system, the parallel simulation when the analog portion of the circuit design was determined to suppressed the injected fault.

3. The method of claim 1, further comprising recording, by the computing system, a diagnostic coverage event corresponding to the alarm logic when the analog portion of the circuit design was determined to suppressed the injected fault, wherein the fault coverage presentation includes the diagnostic coverage event as a part of the diagnostic coverage of the alarm logic.

4. The method of claim 1, further comprising, when the analog portion of the circuit design does not suppress the injected fault, propagating, by the computing system, the value at the output from the analog portion generated during the parallel simulation towards the alarm logic through the digital portion of the simulated circuit design.

5. The method of claim 1, further comprising recording, by the computing system, a diagnostic coverage event when the alarm logic detects the injected fault, which was at least partially propagated through the analog portion of the circuit design during the parallel simulation, wherein the fault coverage presentation includes the diagnostic coverage event as a part of the diagnostic coverage of the alarm logic.

6. The method of claim 1, wherein determining whether the analog portion of the circuit design suppresses the injected fault further comprising:
performing an analog-to-digital conversion on the value at the output of the analog portion during the parallel simulation; and
comparing the converted value to a value change dump value generated during functional verification of the circuit design to detect the injected fault at the output of the analog portion of the circuit design during the parallel simulation.

7. The method of claim 1, further comprising generating, by the computing system, the alarm logic configured to detect the injected fault during a fault simulation of the circuit design.

8. An apparatus comprising at least one computer-readable memory device storing instructions configured to cause one or more processing devices to perform operations comprising:

simulating a circuit design having a digital portion and an analog portion;

injecting a fault into the digital portion of the simulated circuit design, which propagates towards alarm logic configured to detect the injected fault;

when the injected fault propagates to a boundary between the digital portion of the simulated circuit design and the analog portion of the simulated circuit design, performing a parallel simulation of the analog portion relative to the simulation of the analog portion of the circuit design, which propagates the injected fault from the boundary through the analog portion of the circuit design to an output;

determining whether the analog portion of the circuit design suppresses the injected fault propagated through the analog portion from detection by the alarm logic based on a value at the output from the analog portion generated during the parallel simulation; and generating a fault coverage presentation identifying a diagnostic coverage of the alarm logic based, at least in part, on the determination of whether the analog portion of the circuit design suppressed the injected fault during the parallel simulation.

9. The apparatus of claim 8, wherein the instructions are configured to cause one or more processing devices to perform operations further comprising stopping the parallel simulation when the analog portion of the circuit design was determined to suppressed the injected fault.

10. The apparatus of claim 8, wherein the instructions are configured to cause one or more processing devices to perform operations further comprising recording a diagnostic coverage event corresponding to the alarm logic when the analog portion of the circuit design was determined to suppressed the injected fault, and wherein the fault coverage presentation includes the diagnostic coverage event as a part of the diagnostic coverage of the alarm logic.

11. The apparatus of claim 8, wherein the instructions are configured to cause one or more processing devices to perform operations further comprising, when the analog portion of the circuit design does not suppress the injected fault, propagating the value at the output from the analog portion generated during the parallel simulation towards the alarm logic through the digital portion of the simulated circuit design.

12. The apparatus of claim 8, wherein the instructions are configured to cause one or more processing devices to perform operations further comprising recording a diagnostic coverage event when the alarm logic detects the injected fault, which was at least partially propagated through the analog portion of the circuit design during the parallel simulation, and wherein the fault coverage presentation includes the diagnostic coverage event as a part of the diagnostic coverage of the alarm logic.

13. The apparatus of claim 8, wherein determining whether the analog portion of the circuit design suppresses the injected fault further comprising:
performing an analog-to-digital conversion on the value at the output of the analog portion during the parallel simulation; and
comparing the converted value to a value change dump value generated during functional verification of the circuit design to detect the injected fault at the output of the analog portion of the circuit design during the parallel simulation.

14. The apparatus of claim 8, wherein the instructions are configured to cause one or more processing devices to perform operations further comprising generating the alarm logic to detect the injected fault during a fault simulation of the circuit design.

15. A system comprising:
a memory system configured to store computer-executable instructions; and
a computing system, in response to execution of the computer-executable instructions, is configured to:
simulate a circuit design having a digital portion and an analog portion;
inject a fault into the digital portion of the simulated circuit design, which propagates towards alarm logic configured to detect the injected fault;
when the injected fault propagates to a boundary between the digital portion of the simulated circuit design and the analog portion of the simulated circuit design, perform a parallel simulation of the analog portion relative to the simulation of the analog portion of the circuit design, which propagates the injected fault from the boundary through the analog portion of the circuit design to an output;
determine whether the analog portion of the circuit design suppresses the injected fault propagated through the analog portion from detection by the alarm logic based on a value at the output from the analog portion generated during the parallel simulation; and
generate a fault coverage presentation identifying a diagnostic coverage of the alarm logic based, at least in part, on the determination of whether the analog portion of the circuit design suppressed the injected fault during the parallel simulation.

16. The system of claim 15, wherein the computing system, in response to execution of the computer-executable instructions, is further configured to stop the parallel simulation when the analog portion of the circuit design was determined to suppressed the injected fault.

17. The system of claim 15, wherein the computing system, in response to execution of the computer-executable instructions, is further configured to record a diagnostic coverage event corresponding to the alarm logic when the analog portion of the circuit design was determined to suppressed the injected fault, and wherein the fault coverage presentation includes the diagnostic coverage event as a part of the diagnostic coverage of the alarm logic.

18. The system of claim 15, wherein the computing system, in response to execution of the computer-executable instructions, is further configured to, when the analog portion of the circuit design does not suppress the injected fault, propagate the value at the output from the analog portion generated during the parallel simulation towards the alarm logic through the digital portion of the simulated circuit design.

19. The system of claim 15, wherein the computing system, in response to execution of the computer-executable instructions, is further configured to record a diagnostic coverage event when the alarm logic detects the injected fault, which was at least partially propagated through the analog portion of the circuit design during the parallel simulation, and wherein the fault coverage presentation includes the diagnostic coverage event as a part of the diagnostic coverage of the alarm logic.

20. The system of claim 15, wherein the computing system, in response to execution of the computer-executable instructions, is further configured to:
perform an analog-to-digital conversion on the value at the output of the analog portion during the parallel simulation; and
compare the converted value to a value change dump value generated during functional verification of the circuit design to detect the injected fault at the output of the analog portion of the circuit design during the parallel simulation.

* * * * *